United States Patent [19]

Stein

[11] Patent Number: 4,853,593

[45] Date of Patent: Aug. 1, 1989

[54] LIGHT EMITTING DIODE (LED) DISPLAY

[75] Inventor: Karl-Ulrich Stein, Unterhaching, Fed. Rep. of Germany

[73] Assignee: Siemens Aktiengesellschaft, Berlin and Munich, Fed. Rep. of Germany

[21] Appl. No.: 94,464

[22] Filed: Sep. 8, 1987

[30] Foreign Application Priority Data

Sep. 30, 1986 [DE] Fed. Rep. of Germany ....... 3633203

[51] Int. Cl.$^4$ .............................................. H01L 33/00

[52] U.S. Cl. .................................... 313/500; 313/512; 313/114; 313/116; 313/117

[58] Field of Search ............... 313/500, 499, 512, 116, 313/114, 117

[56] References Cited

U.S. PATENT DOCUMENTS

| | | | |
|---|---|---|---|
| 2,074,888 | 3/1937 | Birdseye | 313/114 X |
| 3,827,048 | 7/1974 | Usui | 340/366 R |
| 3,840,858 | 10/1974 | Usui | 340/166 |
| 3,869,637 | 3/1975 | Usui | 313/512 X |
| 3,876,900 | 4/1975 | Amatsuka et al. | 313/510 |
| 4,143,394 | 3/1979 | Schoberl | 313/500 X |
| 4,146,883 | 3/1979 | Appledorn et al. | 340/378.2 |
| 4,152,618 | 5/1979 | Abe et al. | 313/499 X |
| 4,432,131 | 2/1984 | Sadamasa et al. | 29/569 L |
| 4,485,377 | 11/1984 | Claus et al. | 313/500 X |

FOREIGN PATENT DOCUMENTS

| | | |
|---|---|---|
| 0075151 | 3/1983 | European Pat. Off. . |
| 3048288 | 7/1982 | Fed. Rep. of Germany . |
| 3320953 | 12/1984 | Fed. Rep. of Germany . |
| 2184810 | 12/1973 | France . |
| 2197201 | 3/1974 | France . |

OTHER PUBLICATIONS

M. George Craford; "Recent Developments in Light--Emitting-Diode Technology"; 7/7/77; IEEE Transactions on Electron Devices; pp. 935–943.

*Primary Examiner*—Palmer C. DeMeo

*Attorney, Agent, or Firm*—John F. Moran

[57] ABSTRACT

Light emitting diode (LED) display devices having several luminous segments are disposed inside a transparent front support plate and each of a plurality of light emission diodes is associated with one of the respective luminous segment via a light conducting segment. This display device requires little space, is easy and cost-effective to manufacture, and permits great design flexibility in order to make possible an expansion of its area of use. The invention provides to this end that the light conducting segment is formed in the region of the respective luminous segment as a quasi planar light guide structure for the distribution of the light emitted by the respective light emission diode in the region of the luminous segment. The light emitting diode display device in accordance with the invention is suitable as a LED display for numerals and/or symbols.

9 Claims, 2 Drawing Sheets

LIGHT EMITTING DIODE (LED) DISPLAY

BACKGROUND OF THE INVENTION

This invention relates to a light emitting diode (LED) display device and it relates, more particularly, to such an arrangement wherein several segments are illuminated to display information.

In light emitting diode displays, typically known also as LED displays, a key problem is to distribute the light emitted by a very small semiconductor chip, having a rather small emitting region with typical length of, for example, 300 μm or less, over a large luminous segment, whose dimensions (length/width) are, for instance, 1 mm×5 mm.

Conventional displays include, for example, the so-called seven-segment displays. In these devices the numerals or symbols are composed of individual luminous bars (luminous segments). With a total of seven segments the numerals 0 to 9 can be represented, and for special cases a limited number of letters. The basic pattern is an upright rectangle, divided in the middle by a horizontal bar. The individual luminous segments are illuminated for display with light emittng diodes, abbreviated LED. These systems are widely used because they offer the advantages of low power consumption, small space requirement, great brightness and good readability also under small angles of incidence.

In these current seven-segment displays, a funnel-shaped reflector, at the base of which the LED chip is located, is used in a cap for each luminous segment. This funnel-shaped reflector, which functions on the principle of diffuse reflection, is filled with a resin containing a little diffusor substance and is connected to the chip-carrying lead frame (metal spider).

SUMMARY OF THE INVENTION

It is an object of the present invention to provide a LED display which provides high efficiency distribution of the light emerging from a LED chip over the associated luminous segment.

Another object is to provide a relatively simple and cost-effective manufacture particularly using conventional methods, requires very little space, and, with the use of an identical manufacturing line, allows great versatility in design and hence wider possibilities of applications for the displays.

According to the invention, this problem is solved by a light emitting diode (LED) display device having a light conduction segment taking the form of a generally planar light guide structure for highly efficient distribution of the light emitted by the light emitting diode associated with the luminous segment.

In some of the further aspects of the invention, the light emitting diode is in the form of a LED chip. The light guide structure may be located within or outside of the region covered by the luminous segment. The light conduction segment may cover the entire luminous segment.

In the LED display according to the invention there is used—instead of the known principle utilizing a funnel-shaped deep reflector—a quasi planar light guide structure for distributing the light originating from the LED chip in the region of a luminous segment.

The coupling in of light into the planar light guide structure takes place at the edge outside the luminous segment or in the region of the luminous segment. The light guide covers the entire luminous segment. The guiding of the light in the light guide occurs by refractive index difference, e.g. at the interface of synthetic material on the front and air on the back of the light guide or by at least one reflector layer, e.g. on the front support plate to the synthetic light guide. At the luminous segment the light emerges through raster type openings, which may preferably be covered with a diffusor layer raster. On the visible side the reflector layer shows the basic color of the display. The openings for light emergence are taken to increase over the length of the light guide, similarly as in screen printing. In this manner, the entire luminous segment appears as being illuminated uniformly.

The chips themselves are expediently glued onto the conductor tapes and contacted with wires using a conventional practice. Expediently the chips are physically connected with the light guide with incorporation of the conductor tape in the vicinity of the chip as reflector.

The advantages achieved in accordance with the invention are in particular that, compared with those known until now, the device allows relativey simple manufacture, which occurs in a matrix from the start. Also, the device requires little space. Moreover, the proposed device has inherently a much greater design flexibility than the known devices with reflector caps. The proposed device allows using the LED technology, beyond the earlier applications, for specific luminous panels with segments, symbols and alphanumerical signs.

Preferably the LED display according to the invention is manufactured as follows:

A transparent front support plate colored in the display color is printed with the reflector and diffusor raster either in a matrix or in strips.

Coloring the front support plate (foil) in the display or emission color serves to increase the contrast. For a multi-color display it may be appropriate to use a front support plate or foil or neutral color.

The conductor tape is equipped with chips and contacted which may be presented if desired.

The light conduction segments are produced on the front support plate by one or more printing operations using a printing method which permits thick layers, for example, screen printing.

The conductor tape including the chips is connected with the light conduction segments, which are at least in part still liquid. If necessary, to support this connection the chips are also dabbled with the still liquid light guide material, areawise. For the light guide material, a transparent synthetic resin may be used.

The individual components are separated from the previous matrix array or strip union and optionally framed.

The framing is preferaly to be dispensed with. This is possible by using the synthetic material unit of light guide and chip dabbling also as adhesive for attaching the contact ends of the lead frame on the front support plate.

BRIEF DESCRIPTION OF THE DRAWING

The invention will be further explained with reference to the embodiments shown purely schematically in the figures of the drawing. Parts which do not necessarily contribute to comprehension of the invention are not labeled in the figures or are omitted.

DETAILED DESCRIPTION

Figure 1:
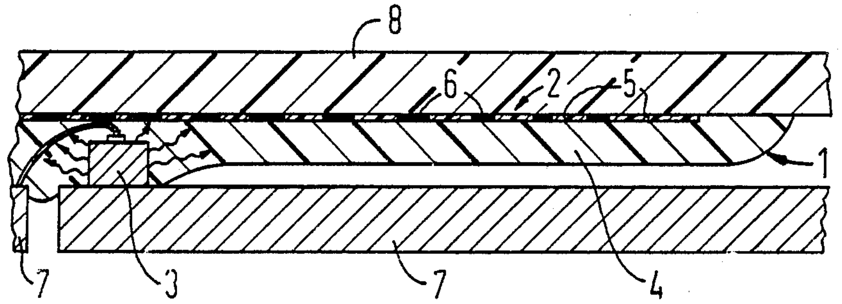
FIG. 1 is a schematic transverse cross section through a portion of a luminous segment of the LED display of the invention.
Figure 2:
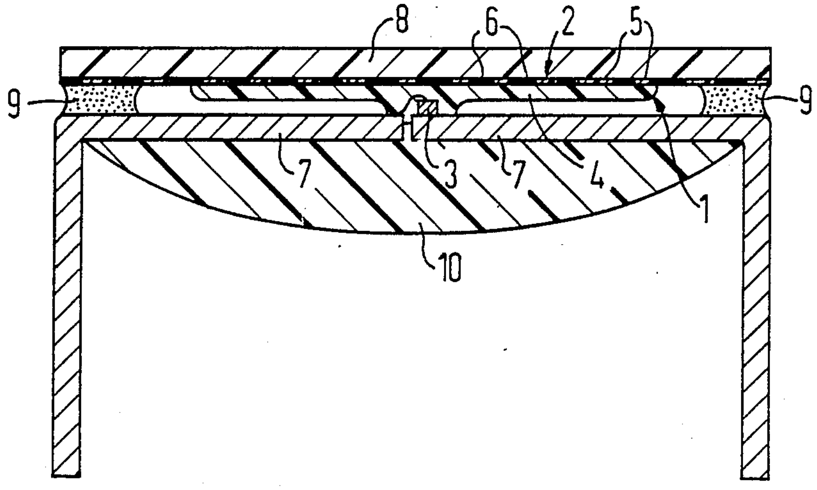
FIG. 2 is a schematic transverse cross section through a complete LED display of the invention including terminals.

The LED display device illustrated in FIGS. 1 and 2 essentially comprises a luminous segment 2 which is disposed on the inner side of a transparent front support plate 8 and with which a LED chip 3 is associated. LED chip 3 is connected with the respective luminous segment 2 via a light conduction segment 4. In the region of the luminous segment 2, the light conducting segment 4 is formed as a quasi planar light guide structure 1 for uniform distribution of the light emitted from the LED chip 3 in the region of the luminous segment 2. The luminous segment 2 is applied on the front support plate 8, comprising for example of synthetic material and colored in the display color, in the form of a raster which constitutes a diffusor layer 5 and a reflector layer 6. The conductor tape 7 is equipped with the LED chip 3 and contacted. The space between segment 4, plate 8 and conductor tape 7 left free by segment 4 (which comprises for example of a transparent synthetic material) contains air.

In the illustrative embodiment of the invention in FIG. 2, the LED display device, whose construction essentially corresponds to that of the device shown in FIG. 1, is provided with electrical connections. To this end, the conductor tape 7 is formed as a so-called lead frame. The connection 9 between front support plate 8 and the lead frame is expediently made by gluing. The angularly extending parts of the lead frame form the terminal legs of the device. The conductor tape 7 and front plate 8 are joined together by a preferably white, diffusely reflecting synthetic material seal 10.

Figure 3:
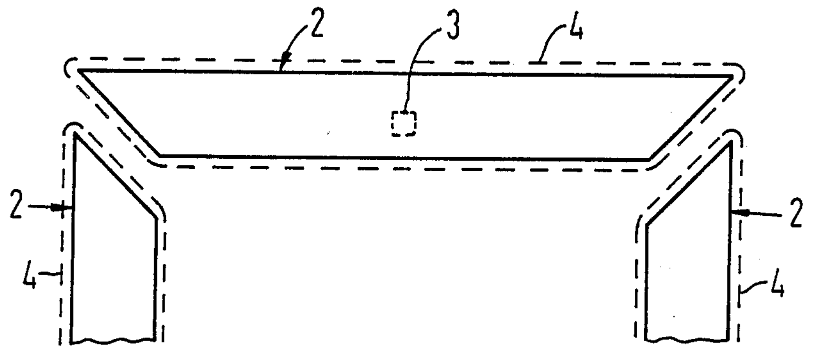
FIG. 3 shows an arrangement from a viewing perspective or top view of the luminous segment, light guide and LED chip.
Figure 4:
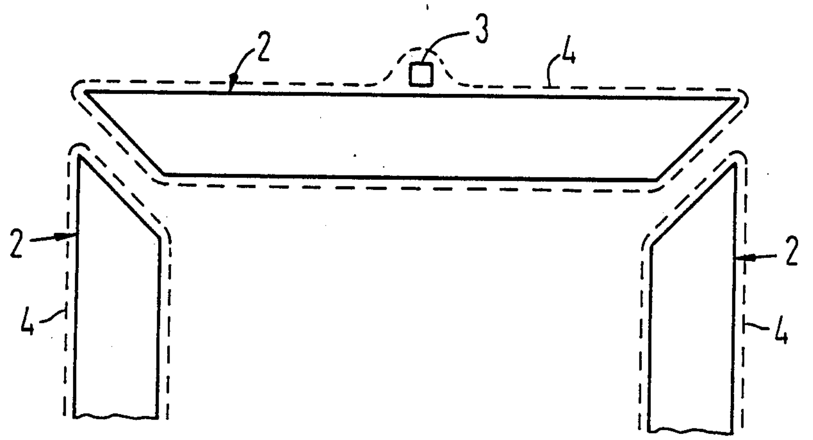
FIG. 4 is another arrangement of the luminous segment light guide and LED chip.

In FIGS. 3 and 4, examples for the arrangement of the luminous segment 2, including light conduction segment 4 and LED chip 3 are illustrated purely schematically in top view in a detail. In the example of FIG. 3, the LED chip 3 is arranged in the light conduction segment 4 inside the region covered by the luminous segment 2.

In the example of FIG. 4, the LEd chip 3 is arranged in the light conduction segment 4 outside the region covered by the luminous segment 2.

There has thus been shown and described novel light emitting diode display devices which fulfill all the objects and advantages sought therefor. Many changes, modifications, variations and other uses and applications of the subject invention will, however, become apparent to those skilled in the art after considering this specification and the accompanying drawing which disclose the preferred embodiments thereof. All such changes, modifications, variations and other uses and applications which do not depart from the spirit and scope of the invention are deemed to be covered by the invention which is limited only by the claims which follow.

What is claimed is:

1. An LED display device comprising: a transparent, front panel having an exterior side and an inner side; a plurality of luminous segments each having a predetermined luminous area and located on the inner side of the transparent, front panel; each luminous segment having a corresponding LED chip; each LED chip being connected to its corresponding segment via a light guide structure; the light guide structure in the region of the corresponding LED chip being a quasi planar structure and extending away from its corresponding LED chip for distribution of light emitted by the corresponding LED chip over the predetermined luminous area; a reflector layer disposed between the inner side of the front panel and the light guide structure and occupying at least most of the luminous area of each luminous segment, the reflector layer having apertures or openings in a raster pattern forming a grid between the openings, a diffusor layer occupying each of the openings in the reflector layer and disposed between the inner side of the front panel and its respective luminous segment; and a conductor tape forming a lead frame to which each LED is glued.

2. A display device according to claim 1, wherein the the light guide structure includes a light conducting segment having the LED chip embedded therein.

3. A display device according to claim 1, wherein the light guide structure includes a light conducting segment having the LED chip embedded therein in a location laterally displaced to a side of the luminous segment.

4. A display device according to claim 1, wherein the light guide structure includes a light conducting segment which is coextensive with the luminous segment.

5. A display device according to claim 2, wherein the light conducting sgment is substantially coextensive with the luminous segment.

6. A display device according to claim 2, wherein the light conducting segment is completely coextensive with the luminous segment.

7. A display device according to claim 1, wherein the apertures or openings of the reflector layer occupy a greater portion of the luminous area along the length of the light conducting segment away from its LED chip.

8. A display device according to claim 1, wherein the reflector layer has a basic color corresponding to that of the display on the side away from the LED chip.

9. A display device according to claim 1, wherein the conductor tape and front panel are connected together by a diffusely reflecting synthetic material seal.

* * * * *